United States Patent
Fujii

(10) Patent No.: US 7,652,408 B2
(45) Date of Patent: Jan. 26, 2010

(54) PIEZOELECTRIC DEVICES, PROCESS FOR PRODUCING THE PIEZOELECTRIC DEVICE, AND INKJET RECORDING HEAD

(75) Inventor: Takamichi Fujii, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 231 days.

(21) Appl. No.: 11/783,221

(22) Filed: Apr. 6, 2007

(65) Prior Publication Data

US 2007/0236104 A1      Oct. 11, 2007

(30) Foreign Application Priority Data

Apr. 7, 2006    (JP) .............................. 2006-106256

(51) Int. Cl.
*H01L 41/08* (2006.01)

(52) U.S. Cl. .................. 310/311; 29/25.35; 29/364; 310/358; 347/70; 438/653

(58) Field of Classification Search .................. 310/311; 427/100
See application file for complete search history.

(56) References Cited

U.S. PATENT DOCUMENTS

| | | | |
|---|---|---|---|
| 6,861,356 B2 * | 3/2005 | Matsuse et al. | 438/653 |
| 2002/0197856 A1 * | 12/2002 | Matsuse et al. | 438/652 |
| 2005/0191803 A1 * | 9/2005 | Matsuse et al. | 438/202 |
| 2007/0236104 A1 * | 10/2007 | Fujii | 310/358 |
| 2008/0055369 A1 * | 3/2008 | Saito | 347/70 |

FOREIGN PATENT DOCUMENTS

| | | |
|---|---|---|
| JP | 2003-188432 A | 7/2003 |
| JP | 2004-186646 A | 7/2004 |
| JP | 2004-262253 A | 9/2004 |

* cited by examiner

*Primary Examiner*—Mark Budd
(74) *Attorney, Agent, or Firm*—Birch, Stewart, Kolasch & Birch, LLP

(57) ABSTRACT

A process for producing a piezoelectric device constituted by a first electrode, at least one second electrode, and a piezoelectric film sandwiched between the first electrode and the at least one second electrode so that an electric field can be applied to the piezoelectric film. First, a seed layer of a material containing at least one element is formed on a substrate, and then the first electrode is formed on the seed layer. Next, the at least one element is diffused through the first electrode so that the at least one element precipitates on a surface of the first electrode on the opposite side to the seed layer, and then the piezoelectric film is formed on the first electrode.

14 Claims, 5 Drawing Sheets

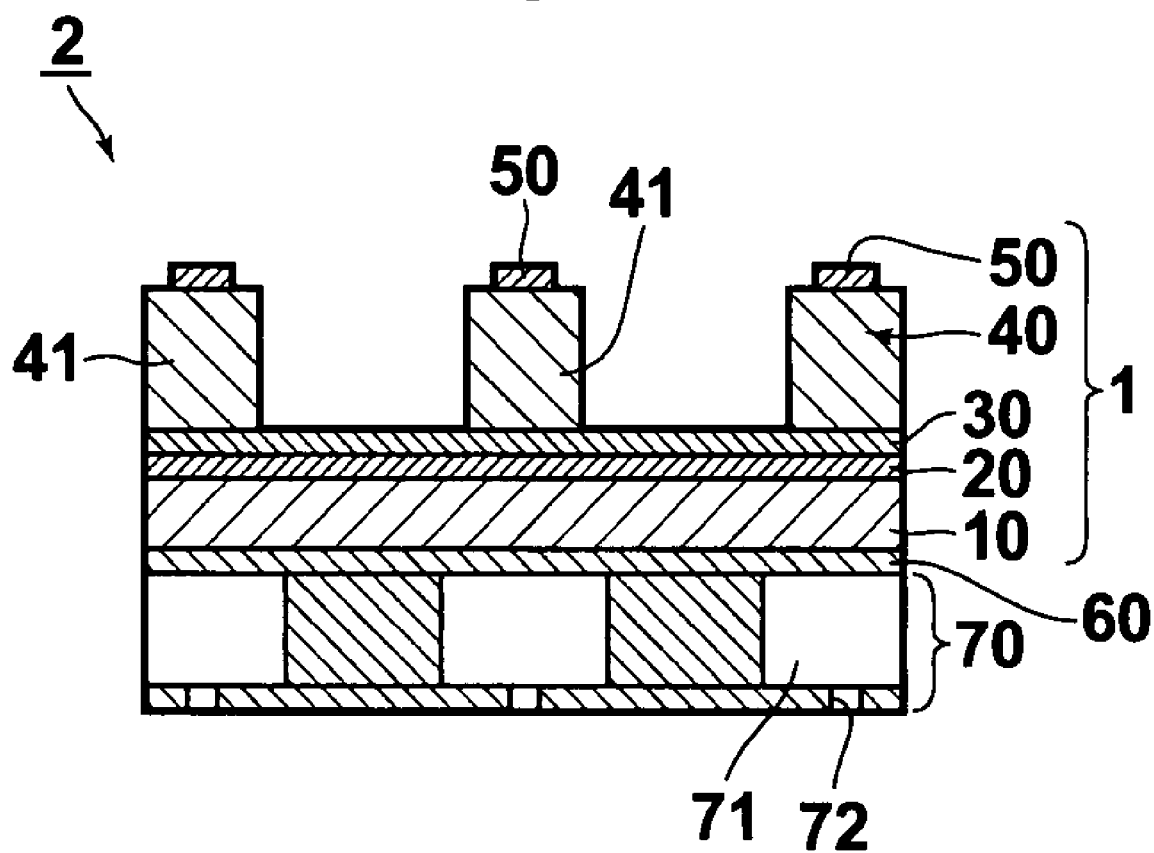

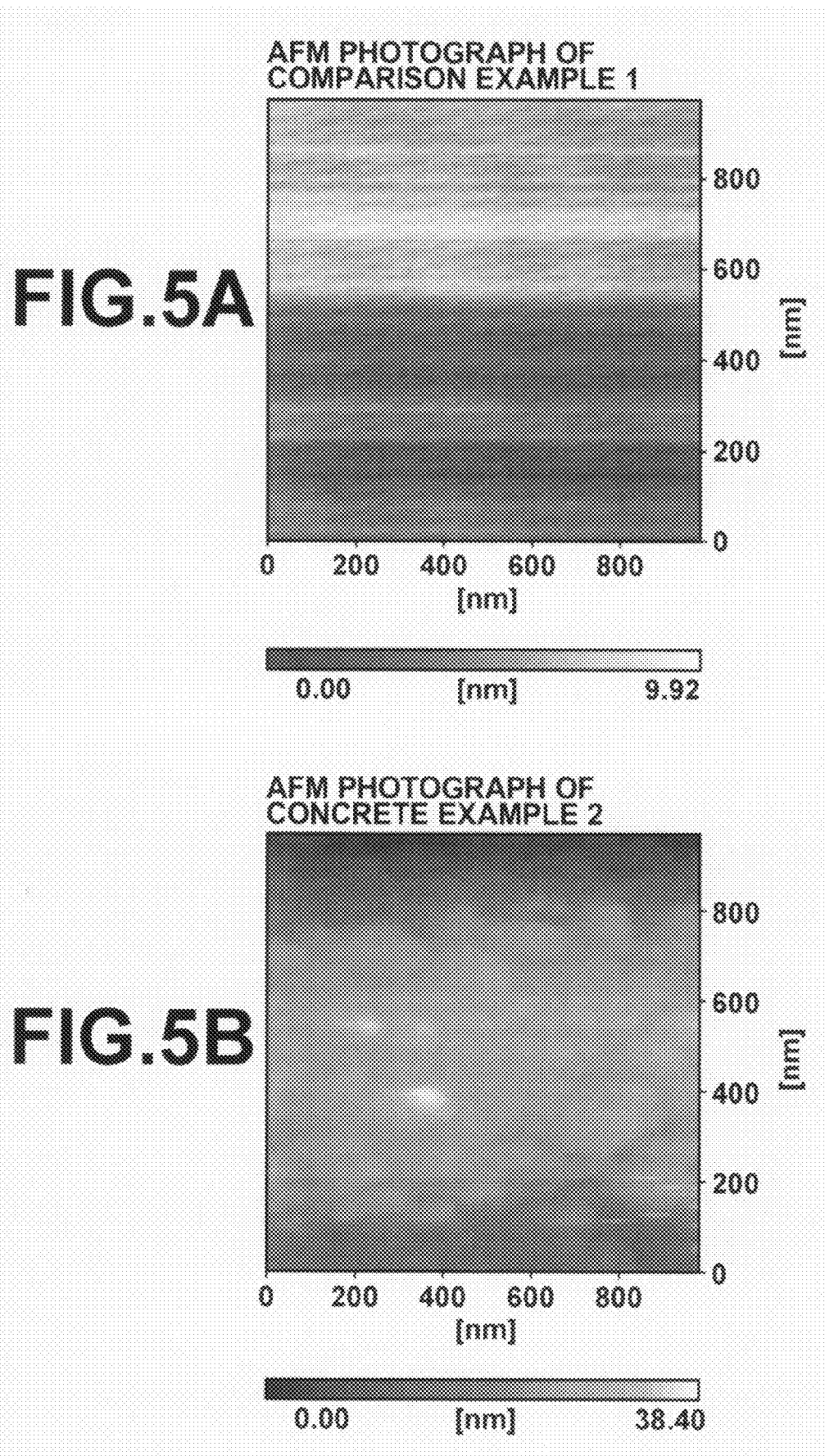

PIEZOELECTRIC DEVICES, PROCESS FOR PRODUCING THE PIEZOELECTRIC DEVICE, AND INKJET RECORDING HEAD

BACKGROUND OF THE INVENTION

1. Field of the Invention

The present invention relates to a piezoelectric device for use in an inkjet recording head, a process for producing the piezoelectric device, and an inkjet recording head using the piezoelectric device.

2. Description of the Related Art

Currently, piezoelectric devices constituted by a piezoelectric film and electrodes are used as, for example, actuators installed in inkjet recording heads, where the piezoelectric film expands and contracts according to increase and decrease in the strength of an electric field applied from the electrodes to the piezoelectric film in a predetermined direction. For example, perovskite oxides such as PZT (lead titanate zirconate) are known as materials suitable for the piezoelectric film.

When the vector direction of the spontaneous polarization axis in the piezoelectric film coincides with the direction of the electric field applied to the piezoelectric film, the expansion and contraction according to increase and decrease in the strength of the electric field effectively occur, so that the piezoelectric constants become great. It is most preferable that the direction of the spontaneous polarization axis in the piezoelectric film completely coincide with the direction of the electric field applied to the piezoelectric film. In addition, in order to suppress the variations of the ink discharge amount, it is desirable that the variations in the piezoelectric performance of the piezoelectric film over the surface of the piezoelectric film be small. In consideration of the above circumstances, it is desirable that the piezoelectric film have high degree of crystal orientation.

For example, Japanese Unexamined Patent Publication No. 2004-186646 (hereinafter referred to as JPP 2004-186646) discloses a technique of growing a PZT film which is preferredly oriented along the (001) plane on a surface of a lower electrode of noble metal containing titanium, where the lower electrode is formed by concurrent sputtering of titanium and noble metal such as platinum, and titanium is insularly precipitated on the surface of the lower electrode.

In addition, Japanese Unexamined Patent Publication No. 2004-262253 (hereinafter referred to as JPP 2004-262253) discloses that it is possible to form a PZT film having high degree of crystal orientation by using a MgO substrate.

According to the technique disclosed in JPP 2004-186646, it is possible to form a PZT film exhibiting crystal orientation. However, as indicated in the embodiments 1 to 5 in JPP 2004-186646, the values of the piezoelectric constant $d_{31}$ of the PZT films obtained according to the embodiments 1 to 5 in JPP 2004-186646 range from 122 to 138 pm/V (i.e., −122 to −138 pC/N), and no PZT film having the piezoelectric constant $d_{31}$ of 150 pm/V or greater is reported in JPP 2004-186646.

On the other hand, since the MgO substrate, which is required to be used in the technique disclosed in JPP 2004-262253, is expensive, the use of the technique disclosed in JPP 2004-262253 increases the manufacturing cost.

In addition, according to the techniques disclosed in JPP 2004-186646 and JPP 2004-262253, it is basically necessary that the film-formation temperature at which the PZT film is formed be 600° C. or higher, as indicated in the embodiments 1, 2, 4, and 5 in JPP 2004-186646. In addition, the lowest film-formation temperature indicated in JPP 2004-186646 is 580° C. (in the embodiment 3 in JPP 2004-186646). Thus, it is conjectured that the film-formation temperature is required to be 580° C. or higher according to the techniques disclosed in JPP 2004-186646. However, when the PZT film is formed at high temperatures, lead loss can occur in the PZT film, so that the piezoelectric performance can deteriorate.

SUMMARY OF THE INVENTION

The present invention has been made in view of such circumstances.

The first object of the present invention is to provide a process for producing a piezoelectric device exhibiting high degree of crystal orientation and high piezoelectric performance, at a relatively low temperature without use of an expensive substrate such as the MgO substrate.

The second object of the present invention is to provide a piezoelectric device which is produced by the above process, and exhibits high degree of crystal orientation and high piezoelectric performance.

The third object of the present invention is to provide an inkjet recording head having the above piezoelectric device.

The fourth object of the present invention is to provide an inkjet recording apparatus having the above piezoelectric device.

(I) In order to accomplish the above first object, according to the first aspect of the present invention, a process for producing a piezoelectric device is provided, where the piezoelectric device is constituted by a first electrode, at least one second electrode, and a piezoelectric film sandwiched between the first electrode and the at least one second electrode so that an electric field can be applied to the piezoelectric film. The process according to the first aspect of the present invention comprises the steps of: (a) forming on a substrate a seed layer of a material containing at least one element; (b) forming the first electrode on the seed layer; (c) diffusing the at least one element through the first electrode so that the at least one element precipitates on a surface of the first electrode on the opposite side to the seed layer; and (d) forming the piezoelectric film on the first electrode.

That is, in the process according to the first aspect of the present invention, the seed layer and the first electrode are successively formed on the substrate, and then the at least one element contained in the seed layer is diffused so that the at least one element precipitates on the upper surface of the first electrode. Thereafter, the piezoelectric film is formed on the first electrode. Therefore, it is possible to form the piezoelectric film exhibiting high degree of crystal orientation and high piezoelectric performance, at a relatively low temperature without use of an expensive substrate such as the MgO substrate. Specifically, in the process according to the first aspect of the present invention, it is possible to form the piezoelectric film at temperatures in the range of 400° C. to 700° C., and produce a piezoelectric device with a piezoelectric film which has a piezoelectric constant $d_{31}$ of 150 pm/V or greater. Further, in the process according to the first aspect of the present invention, it is possible to produce a piezoelectric device with a piezoelectric film which has a tetragonal or rhombohedral crystal structure and crystal orientation along a (100) or (001) face.

Preferably, the above process according to the first aspect of the present invention may further comprise one or any possible combination of the following additional features (i) to (ix).

(i) The at least one element diffused in the step (c) includes at least one element constituting the piezoelectric film.

(ii) The piezoelectric film is formed in the step (c) at a temperature equal to or higher than 400° C. and lower than 600° C.

(iii) The seed layer has a thickness of 5 to 50 nm, and the first electrode has a thickness of 50 to 500 nm.

(iv) The at least one element is diffused in the step (c) so that the surface has an arithmetic average surface roughness Ra of 0.5 to 30.0 nm after the step (c) is completed. The values of the arithmetic average surface roughness Ra in this specification are obtained in accordance with JIS (Japanese Industrial Standard) B0601-1994.

(v) The at least one element includes titanium.

(vi) In the process having the additional feature (v), titanium as the at least one element is thermally diffused by heat treatment which is performed at a temperature in the range of 400° C. to 700° C.

(vii) In the process having the additional feature (vi), the thermal diffusion of titanium is performed for 10 minutes to 2 hours.

(viii) The piezoelectric film has a tetragonal or rhombohedral crystal structure and crystal orientation along a (100) or (001) face.

In this specification, the expression "the piezoelectric film has crystal orientation" means that the piezoelectric film exhibits a degree F. of orientation equal to or greater than 80% obtained by the Lotgerling technique. The degree F. of orientation is defined by the formula, $$F(\%) = (P - P0)/(1 - P0) \times 100, \qquad (1)$$

where P is the ratio of the total XRD (X-ray diffraction) intensity from an orientation plane to the total XRD intensity from all the crystal planes, and P0 is the value of P in the case where the sample is completely randomly oriented. In the case of the (001) orientation, $P = \Sigma I(001)/\Sigma I(hkl)$ where $I(hkl)$ is the XRD intensity from the crystal plane (hkl), $\Sigma I(001)$ is the total XRD intensity from the crystal plane (001), and $\Sigma I(hkl)$ is the total XRD intensity from all the crystal planes (hkl). For example, in the case of the (001) orientation in a perovskite crystal, $P = I(001)/\{I(001) + I(100) + I(101) + I(110) + I(111)\}$. When the sample is completely randomly oriented, F=0%. When the sample is completely oriented, F=100%.

(ix) The piezoelectric film is formed of at least one perovskite oxide or at least one mixed crystal of perovskite oxides, and the at least one perovskite oxide and the perovskite oxides are one or more of lead titanate, lead titanate zirconate, barium titanate, bismuth sodium titanate, bismuth potassium titanate, sodium niobate, potassium niobate, and lithium niobate. (The piezoelectric film may contain inevitable impurities.)

(II) In order to accomplish the aforementioned second object, a piezoelectric device according to the second aspect of the present invention is provided. The piezoelectric device according to the second aspect of the present invention is a piezoelectric device produced by the process according to the first aspect of the present invention.

In order to accomplish the aforementioned second object, a piezoelectric device according to the third aspect of the present invention is also provided. The piezoelectric device according to the third aspect of the present invention comprises: a substrate; a first electrode formed over the substrate; a piezoelectric film formed on the first electrode; and at least one second electrode formed on the piezoelectric film. In the piezoelectric device according to the third aspect of the present invention, the piezoelectric film is sandwiched between the first electrode and the at least one second electrode so that an electric field can be applied to the piezoelectric film, at least one element constituting the piezoelectric film precipitates on a surface of the first electrode on the opposite side to the substrate, and the surface has an arithmetic average surface roughness Ra of 0.5 to 30 nm.

Preferably, in the piezoelectric devices according to the second and third aspects of the present invention, the piezoelectric film has a piezoelectric constant $d_{31}$ of 150 pm/V or greater.

In this specification, the piezoelectric constant $d_{31}$ is obtained as follows.

The amount of displacement of the piezoelectric film is measured by using a laser Doppler vibrometer under the condition that rectangular pulses of the electric field with the field strength of 60 kV/cm are applied to the piezoelectric film at the frequency of 30 kHz, which is a typical condition under which the piezoelectric device according to the present invention is driven in practical use. The above measurement is performed at intervals of 10 mm along each of the x and y directions parallel to the substrate. At the same time, the driving frequency at which the displacement is maximized is obtained as the resonance frequency by varying the driving frequency. Then, the piezoelectric constant $d_{31}$ at each measurement point is obtained by analysis (using the structural analysis software "ANSYS") of the results of the above measurement, and an average of the values of the piezoelectric constant $d_{31}$ at all the measurement points is obtained as the value of the piezoelectric constant $d_{31}$ of the piezoelectric film.

(III) In order to accomplish the aforementioned third object, an inkjet recording head according to the fourth aspect of the present invention is provided. The inkjet recording head according to the fourth aspect of the present invention comprises: the piezoelectric device according to the second aspect of the present invention; and an ink hold-and-discharge member attached to the piezoelectric device. The hold-and-discharge member has one or more ink chambers which hold ink, and one or more ink outlets through which the ink is externally discharged from the one or more ink chambers.

In order to accomplish the aforementioned third object, an inkjet recording head according to the fifth aspect of the present invention is also provided. The inkjet recording head according to the fifth aspect of the present invention comprises: the piezoelectric device according to the third aspect of the present invention; and an ink hold-and-discharge member attached to the piezoelectric device. The hold-and-discharge member has one or more ink chambers which hold ink, and one or more ink outlets through which the ink is externally discharged from the one or more ink chambers.

(IV) In order to accomplish the aforementioned fourth object, an inkjet recording apparatus according to the sixth aspect of the present invention is provided. The inkjet recording apparatus according to the sixth aspect of the present invention is an inkjet recording apparatus which comprises the inkjet recording head according to according to the fourth aspect of the present invention.

In order to accomplish the aforementioned fourth object, an inkjet recording apparatus according to the seventh aspect of the present invention is provided. The inkjet recording apparatus according to the seventh aspect of the present invention is an inkjet recording apparatus which comprises the inkjet recording head according to according to the fifth aspect of the present invention.

BRIEF DESCRIPTION OF THE DRAWINGS

FIG. 1 is a cross-sectional view schematically illustrating a cross section of an essential portion of an inkjet recording head having a piezoelectric device according to an embodiment of the present invention.

FIG. 5A is an AFM (atomic force microscope) photograph of a surface of a lower electrode in a comparison example 1.

FIG. 5B is an AFM photograph of a surface of a lower electrode in a concrete example 2.

DESCRIPTION OF PREFERRED EMBODIMENT

Figure 2A:
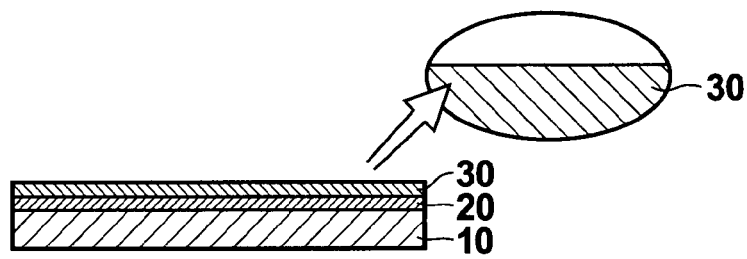
FIGS. 2A, 2B, 2C, 2D, and 2E are diagrams illustrating structures in respective steps in a process for producing the piezoelectric device constituting the inkjet recording head of FIG. 1.

A preferred embodiment of the present invention is explained in detail below with reference to drawings.

Piezoelectric Device and Inkjet Recording Head

Hereinbelow, the structures of a piezoelectric device and an inkjet recording head according to a preferred embodiment of the present invention are explained with reference to FIG. 1, which is a cross-sectional view schematically illustrating a cross section of an essential portion of the inkjet recording head having the piezoelectric device, where the vertical direction corresponds to the thickness direction of the piezoelectric device, and the respective elements are illustrated with such dimensions (different from the actual dimensions) as to clearly indicate the structures of the piezoelectric device and the inkjet recording head.

The piezoelectric device 1 is constituted by a lower electrode 30, a piezoelectric film 40, and upper electrodes 50, which are laminated on a substrate 10 in this order. The piezoelectric film 40 is formed of a piezoelectric inorganic material so that an electric field in the thickness direction can be applied to the piezoelectric film 40 between the lower electrode 30 and the upper electrodes 50.

A seed layer 20, which contains at least one of constituents elements of the piezoelectric film 40, is formed between the substrate 10 and the lower electrode 30. As explained in detail later, the piezoelectric film 40 is formed after an element constituting the piezoelectric film 40 which is contained in the seed layer 20 is (preferably thermally) diffused so that the element precipitates on an upper surface of the lower electrode 30. The seed layer 20 can also have the function of an adhesion layer which makes the lower electrode 30 satisfactorily adhere to the substrate 10.

In the piezoelectric device 1, the seed layer 20 and the lower electrode 30 are formed on the approximately entire upper surface of the substrate 10, the piezoelectric film 40 is constituted by a plurality of piezoelectric elements 41 which protrude from the upper surface of the lower electrode 30, extend in the direction perpendicular to the plane of FIG. 1, and are arranged in a predetermined stripelike pattern, and the upper electrodes 50 are formed on the tops of the piezoelectric elements 41. Alternatively, the pattern of the piezoelectric film 40 is not limited to the above stripelike pattern, and the pattern of the piezoelectric film 40 may be designed as needed. Further alternatively, the piezoelectric film 40 may be realized by a continuously formed film. However, it is preferable that the piezoelectric film 40 be formed of the plurality of piezoelectric elements 41, which are separated from each other, since each piezoelectric element can expand or contract smoothly, so that greater displacement occurs in the piezoelectric film 40.

According to the present embodiment, no special limitation is imposed on the substrate 10. For example, the substrate 10 may be made of silicon, glass, stainless steel, YSZ (yttrium stabilized zirconia), alumina, sapphire, silicon carbide, or the like. In addition, the substrate 10 may be realized by a laminated substrate such as the SOI (silicon-on-insulator) substrate, which is produced by forming an oxide film of $SiO_2$ on a surface of a silicon substrate. According to the present embodiment, it is possible to form the piezoelectric film 40 exhibiting high degree of crystal orientation and high piezoelectric performance without use of an expensive substrate such as the MgO substrate.

In addition, the main component of the lower electrode 30 is not specifically limited, and may be, for example, one or a combination of metals such as Pt or Ir and metal oxides such as $IrO_2$, $RuO_2$, $LaNiO_3$, or $SrRuO_3$. In the case where the main component of the lower electrode 30 is one or a combination of the above materials, it is possible to make an element constituting the piezoelectric film 40 and being contained in the seed layer 20 precipitate on the upper surface of the lower electrode 30.

Further, the main component of the upper electrodes 50 is not specifically limited, and may be, for example, one or a combination of the materials indicated before as the examples of the main component of the lower electrode 30 and the materials such as Al, Ta, Cr, or Cu which are used in electrodes in the general semiconductor processes.

Furthermore, although the material for the piezoelectric film 40 is not specifically limited, it is preferable that the piezoelectric film 40 be formed of one or more perovskite oxides, although the piezoelectric film 40 may contain inevitable impurities. The perovskite oxides may be:

(1) lead compounds such as lead titanate, lead titanate zirconate (PZT), lead zirconate, lead lanthanum titanate, lead lanthanum titanate zirconate, zirconium magnesium niobate-lead titanate, zirconium nickel niobate-lead titanate, and mixed crystals of such lead compounds; and (2) nonlead compounds such as barium titanate, bismuth sodium titanate, bismuth potassium titanate, sodium niobate, potassium niobate, and lithium niobate, and mixed crystals of such nonlead compounds.

The above examples of the perovskite oxides are ferroelectric materials which exhibit spontaneous polarization when no electric field is applied to the ferroelectric materials.

Moreover, the thickness of the piezoelectric film 40 is not specifically limited, is normally 1 micrometer or greater, and is, for example, 1 to 5 micrometers.

As mentioned before, the composition of the seed layer 20 is determined so as to contain one or more elements constituting the piezoelectric film 40.

The thicknesses of the seed layer 20 and the lower electrode 30 are determined so that an element constituting the piezoelectric film 40 and being contained in the seed layer 20 can be diffused and precipitate on the upper surface of the lower electrode 30, and no other limitation is imposed on the thicknesses of the seed layer 20 and the lower electrode 30. However, it is preferable that the thickness of the seed layer 20 be 5 to 50 nm, and the thickness of the lower electrode 30 be 50 to 500 nm. When the thicknesses of the seed layer 20 and the lower electrode 30 are too small, it is difficult to form the seed layer 20 and the lower electrode 30. On the other hand, when the thicknesses of the seed layer 20 and the lower electrode 30 are too great, the time for and the cost of formation of the seed layer 20 and the lower electrode 30 having such great thicknesses unnecessarily increase. In addition, when the thickness of the seed layer 20 is too small, stable supply of the aforementioned element constituting the piezoelectric film 40 and being contained in the seed layer 20 to the lower electrode 30 can become difficult. Further, when the thickness of the lower electrode 30 is too great, it becomes difficult to diffuse the element contained in the seed layer 20 through the lower electrode 30 and make the element reach the upper surface of the lower electrode 30.

According to the present embodiment, as mentioned before, the piezoelectric film 40 is formed after an element constituting the piezoelectric film 40 and being contained in the seed layer 20 is diffused so as to precipitate on the upper surface of the lower electrode 30, so that it is possible to form the piezoelectric film 40 exhibiting high degree of crystal orientation since the precipitate on the upper surface behaves as nuclei in the formation of the piezoelectric film 40.

It is preferable to form the seed layer 20 containing at least one element constituting the piezoelectric film 40, and make the at least one element diffuse through the lower electrode 30 and precipitate on the upper surface of the lower electrode 30. Alternatively, the element which is diffused from the seed layer 20 to the upper surface of the lower electrode 30 may not be an element constituting the piezoelectric film 40, and therefore the seed layer 20 may not contain any of one or more elements constituting the piezoelectric film 40, as long as the precipitate on the upper surface has an affinity for the piezoelectric film 40 and behaves as nuclei in the formation of the piezoelectric film 40 so that the piezoelectric film 40 has high degree of crystal orientation.

The crystals of PZT and the like can have any of the cubic, tetragonal, and rhombohedral structures, and barium titanate and the like can have any of the cubic, tetragonal, triclinic, and rhombohedral crystal structures. Since the cubic crystals do not exhibit piezoelectricity, the piezoelectric film 40 is required to be realized by one of the tetragonal, triclinic, and rhombohedral crystals.

The spontaneous polarization axes of the tetragonal, triclinic, and rhombohedral crystals realizing the structures of ferroelectric materials are <001>, <110>, and <111>, respectively.

As mentioned before, when the vector direction of the spontaneous polarization axis in the piezoelectric film 40 coincides with the direction of the electric field applied to the piezoelectric film (which is perpendicular to the surface of the substrate according to the present embodiment), the expansion and contraction according to increase and decrease in the strength of the electric field effectively occur, so that the piezoelectric constants become great. It is most preferable that the direction of the spontaneous polarization axis in the piezoelectric film completely coincide with the direction of the electric field applied to the piezoelectric film.

Specifically, it is preferable that the piezoelectric film 40 have one of the tetragonal, triclinic, and rhombohedral crystal structures, and be a film having crystal orientation along the (100), (001), or (111) face.

In consideration of the coincidence of the direction of the electric field applied to the piezoelectric device 1 with the spontaneous polarization axis, it is most preferable that the piezoelectric film 40 be preferredly oriented along the (001) plane when the piezoelectric film 40 has a tetragonal crystal structure, along the (001) plane when the piezoelectric film 40 has a triclinic crystal structure, and along the (111) plane when the piezoelectric film 40 has a rhombohedral crystal structure.

For example, it is possible to form a seed layer 20 containing titanium so as to diffuse titanium through the lower electrode 30 and make titanium precipitate on the upper surface of the lower electrode 30 before formation of the piezoelectric film 40. In particular, in the case where the piezoelectric film 40 contains a titanium-containing perovskite oxide such as lead titanate, lead titanate zirconate (PZT), or barium titanate, it is preferable to form a seed layer 20 containing titanium so as to diffuse titanium through the lower electrode 30 and make titanium precipitate on the upper surface of the lower electrode 30 before formation of the piezoelectric film 40.

The present inventor has found that the piezoelectric film 40 having a tetragonal or rhombohedral crystal structure and crystal orientation along the (100) or (001) face can be formed by forming the seed layer 20 as above.

The inkjet recording head 2 of FIG. 1 is formed by attaching an ink nozzle 70 to the lower surface of the substrate 10 through a diaphragm 60. The ink nozzle 70 is a member for holding and discharging ink, and comprises a plurality of ink chambers 71 and a plurality of ink outlets 72, which are arranged in correspondence with the arrangement of the plurality of piezoelectric devices 41 on the lower electrode 30. Each ink chamber 71 holds ink, and the ink held in each ink chamber 71 is discharged out of the ink chamber 71 through the ink outlet 72 connected to the ink chamber 71.

In the above inkjet recording head 2, the strength of the electric field applied to each piezoelectric device 41 is increased or decreased so as to expand or contract the piezoelectric element, and control the discharge and the discharge amount of the ink.

Production Process

Hereinbelow, a process of producing the piezoelectric device 1 and the inkjet recording head 2 is explained with reference to FIGS. 2A, 2B, 2C, 2D, and 2E, which are diagrams illustrating structures in respective steps in a process for producing the piezoelectric device constituting the inkjet recording head of FIG. 1.

<Step A>

The structure produced in the step A in the process for producing the piezoelectric device and a magnified view of a portion of the upper surface of the lower electrode 30 after the step A are illustrated in FIG. 2A.

First, the substrate 10 is prepared. For example, the substrate 10 is a substrate made of silicon, glass, or stainless steel, or an SOI substrate which is made by forming an SiO$_2$ oxide film on a surface of a silicon substrate. Next, the seed layer 20 and the lower electrode 30 are formed in this order over the substrate 10. As illustrated in the magnified view of the portion of the upper surface of the lower electrode 30 in FIG. 2A, in this step, the upper surface of the lower electrode 30 is approximately flat, and the arithmetic average surface roughness Ra is typically less than 0.5 nm. The manners of production of the seed layer 20 and the lower electrode 30 are not specifically limited, and the seed layer 20 and the lower electrode 30 may be formed by the sputtering or the like. It is possible to form the seed layer 20 and the lower electrode 30 by using an identical film formation system or different film formation systems. It is preferable that the seed layer 20 have a thickness of 5 to 50 nm, and the lower electrode 30 have a thickness of 50 to 500 nm.

<Step B>

Figure 2B:
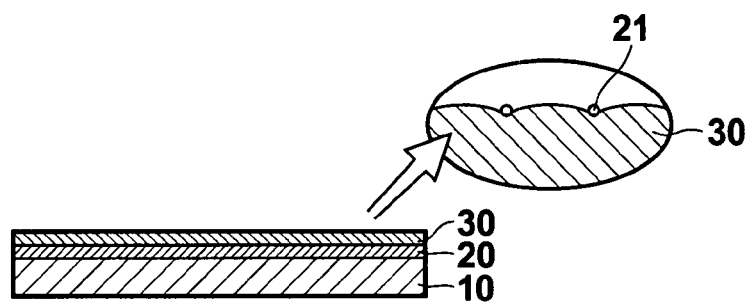

The structure produced in the step B in the process for producing the piezoelectric device and a magnified view of a portion of the upper surface of the lower electrode 30 after the step B are illustrated in FIG. 2B.

An element constituting the piezoelectric film 40 and being contained in the seed layer 20 is diffused through the lower electrode 30 so as to precipitate on the upper surface of the lower electrode 30 as illustrated in the magnified view of the portion of the upper surface of the lower electrode 30 in FIG. 2B, in which the precipitate is indicated by the reference 21. The diffusion may be thermal diffusion by heating, which may be realized by normal heat treatment using a heater, heating by irradiation of light, or the like.

Examples of the thermal diffusion are explained below.

The thermal diffusion temperature and the thermal diffusion time (i.e., the time for which the thermal diffusion is performed) are not specifically limited, and it is sufficient to determine the thermal diffusion temperature and the thermal diffusion time within such ranges that the element can be thermally diffused to a satisfactory degree and other problems such as the deterioration of the substrate 10 do not occur.

The thermal diffusion temperature is preferably 400 to 700° C., and particularly preferably 450 to 650° C. In addition, it is preferable that the thermal diffusion temperature be equal to the film-formation temperature of the piezoelectric film 40, since the operation of changing the temperature at the start of the formation of the piezoelectric film 40 can be dispensed with, and therefore the efficiency in the formation of the piezoelectric film 40 can be increased.

The thermal diffusion time is preferably 10 minutes to 2 hours, although the preferable thermal diffusion time depends on various conditions such as the thermal diffusion temperature and the thickness of the lower electrode 30.

The present inventor has found that fine irregularity occurs at the upper surface of the lower electrode 30 after completion of the operation in the step B. The upper surface of the lower electrode 30 after completion of the operation in the step B has an irregularity like a number of ranging, gently-sloping mountains, and insular precipitate 21 is deposited at the positions corresponding to the valleys between the gently-sloping mountains. (See the AFM photograph of the surface of the lower electrode in the concrete example 2 indicated in FIG. 5B.)

The present inventor has also found that the piezoelectric film 40 exhibiting high degree of crystal orientation can be formed in the following step C in the case where the diffusion is performed under the condition that the arithmetic average surface roughness Ra of the lower electrode 30 after the operation in the step B is 0.5 nm to 30.0 nm. (See the concrete examples 1 to 4, which are explained later.)

<Step C>

Figure 2C:
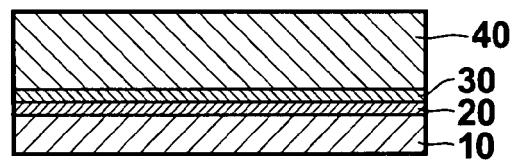
Figure 2D:
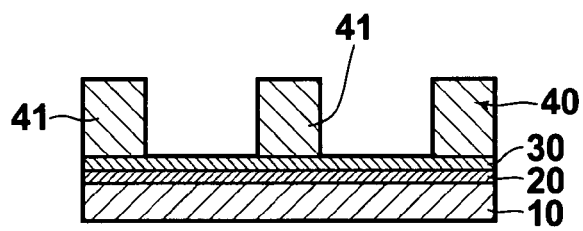

The structures produced in the first and second substeps in the step C in the process for producing the piezoelectric device are respectively illustrated in FIGS. 2C and 2D.

First, as illustrated in FIG. 2C, a piezoelectric film 40 is formed on the approximately entire upper surface of the lower electrode 30 after the precipitate 21 is deposited on the upper surface of the lower electrode 30. The manner of the formation of the piezoelectric film 40 is not specifically limited, and it is preferable to use a vapor deposition technique such as sputtering, metal organic chemical vapor deposition (MOCVD), or pulsed laser deposition for the formation of the piezoelectric film 40. Alternatively, an aerosol deposition technique or a chemical solution deposition (CSD) technique such as the sol gel technique or the metal organic decomposition (MOD), may be used for the formation of the piezoelectric film 40.

Thereafter, as illustrated in FIG. 2D, patterning of the piezoelectric film 40 is performed by using a known technique such as dry etching so that the aforementioned stripe-like pattern of the piezoelectric film 40 in which the plurality of piezoelectric elements 41 are arranged is formed on the lower electrode 30.

Since, according to the present embodiment, the element is diffused through the lower electrode 30 so that the element precipitates on the upper surface of the lower electrode 30 and is distributed over the upper surface of the lower electrode 30 before formation of the piezoelectric film 40, the precipitate 21 distributed over the upper surface of the lower electrode 30 behaves as nuclei in crystal growth during the formation of the piezoelectric film 40. Thus, it is possible to form the piezoelectric film 40 so as to exhibit high degree of crystal orientation and high piezoelectric performance.

As mentioned in the "Description of the Related Art," JPP 2004-186646 discloses a technique of growing a PZT film which is preferredly oriented along the (001) plane on a lower electrode of noble metal containing titanium, where the lower electrode is formed by concurrent sputtering of titanium and noble metal such as platinum, and titanium is insularly precipitated on a surface of the lower electrode. However, the values of the piezoelectric constant $d_{31}$ of the PZT films obtained by the techniques disclosed in JPP 2004-186646 range from 122 to 138 pm/V (i.e., −122 to −138 pC/N), and no PZT film having the piezoelectric constant $d_{31}$ of 150 pm/V or greater is reported in JPP 2004-186646.

On the other hand, in the piezoelectric device 1 according to the present embodiment, it is possible to achieve the piezoelectric constant $d_{31}$ of 150 pm/V or greater, and further 180 pm/V or greater, as indicated later in the concrete examples 1, 2, and 4.

Since titanium is not diffused in the techniques disclosed in JPP 2004-186646, the upper surface of the lower electrode is considered to be approximately flat. Although JPP 2004-186646 does not disclose concrete values of the surface roughness, the surface roughness of the upper surface of the lower electrode disclosed in JPP 2004-186646 can be estimated to be approximately equal to the surface roughness of the lower electrode 30 before the precipitation of titanium. Therefore, for example, the arithmetic average surface roughness of the upper surface of the lower electrode disclosed in JPP 2004-186646 is estimated to be less than 0.5 nm. In addition, the paragraph No. 0059 in JPP 2004-186646 indicates that the thickness of the lower electrode disclosed in JPP 2004-186646 is preferably in the range of 0.02 to 0.2 micrometers, and the crystal orientation in the PZT film is facilitated when the thickness of the lower electrode is in this range since the irregularity of the surface of the electrode becomes 5 nm or smaller. That is, the description of JPP 2004-186646 can be understood to mean that a lower electrode having a smoother upper surface is more preferable.

On the other hand, according to the present embodiment, an element constituting the piezoelectric film 40 and being contained in the seed layer 20 is diffused through the lower electrode 30 so as to precipitate on the upper surface of the lower electrode 30. Therefore, the arithmetic average surface roughness (Ra) of the upper surface of the lower electrode 30 after the diffusion is greater than the arithmetic average surface roughness of the upper surface of the lower electrode in JPP 2004-186646, and is, for example, 0.5 to 30.0 nm. The precipitate 21 containing the element constituting the piezoelectric film 40 and being contained in the seed layer 20 is distributed over the upper surface of the lower electrode 30, so that the upper surface of the lower electrode 30 has irregularity which is suitable for formation of the piezoelectric film 40.

After the diffusion of the element constituting the piezoelectric film 40 and being contained in the seed layer 20, an irregularity like a number of ranging, gently-sloping mountains is produced on the upper surface of the lower electrode 30, and the insular precipitate 21 is deposited at the positions corresponding to the valleys between the gently-sloping mountains. Therefore, the precipitate 21 deposited at the recessed portions of the upper surface of the lower electrode 30 behaves as nuclei in the growth of the piezoelectric film 40. Thus, it is possible to consider that the upper surface of the lower electrode 30 according to the present embodiment is more suitable for the base for crystal growth than the approximately flat upper surface of the lower electrode in JPP 2004-186646.

As mentioned in the "Description of the Related Art," according to the techniques disclosed in JPP 2004-186646, conventionally, it is basically necessary to raise the temperature to 600° C. or higher during formation of the PZT film as indicated in the embodiments 1, 2, 4, and 5 in JPP 2004-186646, and it is conjectured that the film-formation temperature is required to be 580° C. or higher since the lowest film-formation temperature indicated in JPP 2004-186646 is 580° C. (in the embodiment 3 in JPP 2004-186646). However, when the PZT film is formed at high temperatures, lead loss can occur in the PZT film and the piezoelectric performance can deteriorate.

On the other hand, according to the present embodiment, the upper surface of the lower electrode 30 is suitable for use as a base for growth of the piezoelectric film 40. Therefore, it is possible to form the piezoelectric film 40 at a relatively low temperature. Specifically, the film-formation temperature is in the range equal to or greater than 400° C. and lower than 600° C., so that it is possible to form the piezoelectric film 40 exhibiting high degree of crystal orientation.

In the case where the piezoelectric film 40 is formed of a material containing lead such as PZT, the film-formation temperature is preferably 450 to 580° C., and particularly preferably 500 to 580° C. When the piezoelectric film 40 of the lead-containing material is formed under the above condition, the piezoelectric film 40 of the lead-containing material can be stably formed, and the formed piezoelectric film 40 has satisfactory crystal orientation. In addition, the loss of lead can be suppressed, so that the formed piezoelectric film 40 exhibits high performance.

As explained above, according to the present embodiment, the upper surface of the lower electrode 30 has a structure suitable for use as a base for growth of the piezoelectric film 40, and the piezoelectric film 40 can be formed at a relatively low temperature, so that both of these advantages contribute to formation of the piezoelectric film 40 having higher performance than the piezoelectric film formed by the techniques disclosed in JPP 2004-186646.

Further, the seed layer 20 may be dispensed with in the piezoelectric device 1 as long as the following conditions (a) and (b) are satisfied.

(a) At least one element constituting the piezoelectric film 40 precipitates on the upper surface of the lower electrode 30.

(b) The upper surface of the lower electrode 30 has the arithmetic average surface roughness (Ra) of 0.5 to 30 nm.

Generally, a piezoelectric device being constituted by a lower electrode, a piezoelectric film, and an upper electrodes formed in this order over a substrate and satisfying the above conditions (a) and (b) is not conventionally known.

<Step D>

Figure 2E:
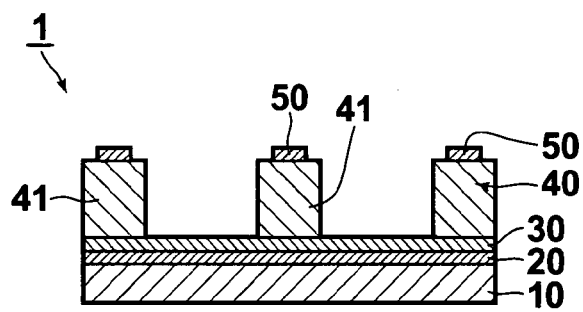

The structure produced in the step D in the process for producing the piezoelectric device is illustrated in FIG. 2E.

After the patterning of the piezoelectric film 40 is performed in the step C, the upper electrodes 50 are formed on the tops of the piezoelectric element 41 as illustrated in FIG. 2E. In addition, when necessary, the bottom surface of the substrate 10 is etched so as to reduce the thickness of the substrate 10. Thus, the production of the piezoelectric device 1 is completed.

<Step E>

Although not shown, the diaphragm 60 and the ink nozzle 70 are attached to the piezoelectric device 1 produced as above. Thus, the production of the inkjet recording head 2 is completed. Alternatively, it is possible to process portions of the substrate 10 into the diaphragm 60 and the ink nozzle 70, instead of attaching the diaphragm 60 and the ink nozzle 70 to the piezoelectric device 1. For example, in the case where the substrate 10 is realized by a laminated substrate such as an SOI substrate, the ink chambers 71 can be formed by etching the corresponding portions of the bottom surface of the substrate 10, and the diaphragm 60 and the other structures of the ink nozzle 70 can be formed by processing the substrate 10 per se.

As explained above, in the process for producing a piezoelectric device according to the present embodiment, the piezoelectric film 40 is formed on the upper surface of the lower electrode 30 after the formation of the seed layer 20 and the lower electrode 30 in this order on the substrate 10 and the diffusion of the element contained in the seed layer 20 through the lower electrode 30 for precipitation of the element at the upper surface of the lower electrode 30. Therefore, it is possible to form the piezoelectric film 40 exhibiting high degree of crystal orientation and high piezoelectric performance at a relatively low temperature without using an expensive substrate such as the MgO substrate. Specifically, the piezoelectric film 40 can be formed at the film-formation temperature equal to or higher than 400° C. and lower than 600° C. According to the process for producing a piezoelectric device according to the present embodiment, it is possible to produce a piezoelectric device 1 having the piezoelectric constant $d_{31}$ of 150 pm/V or greater.

Inkjet Recording Apparatus

Figure 3:
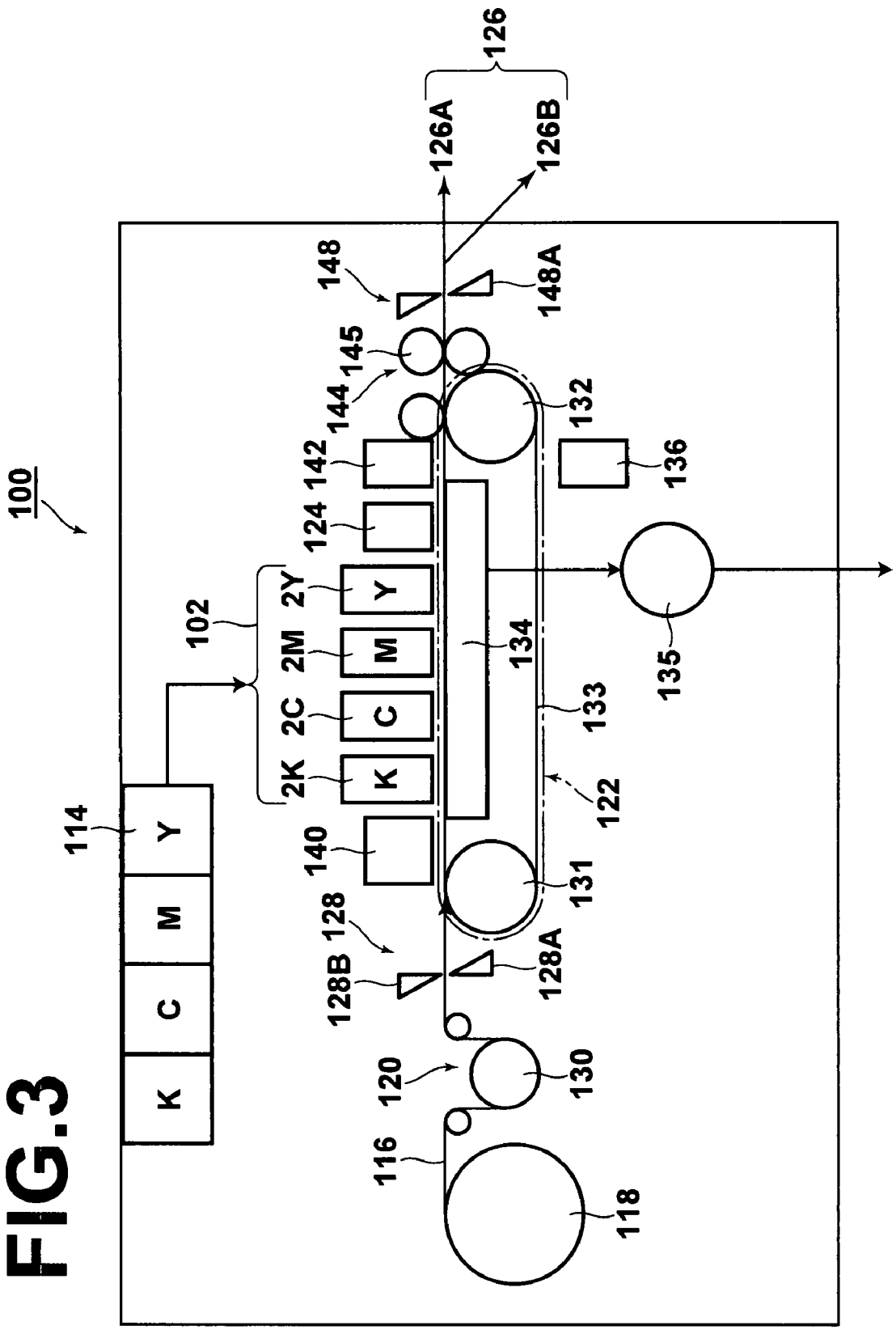
FIG. 3 is a schematic diagram of an example of an inkjet recording apparatus having the inkjet recording head of FIG. 1.
Figure 4:
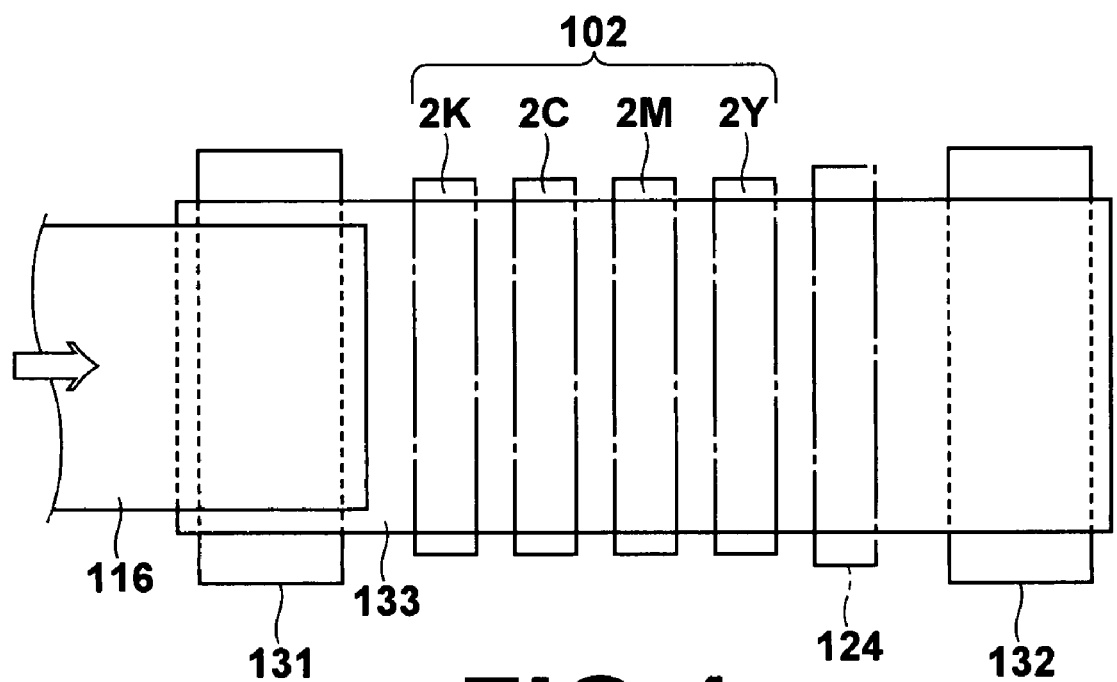
FIG. 4 is a top view of a portion of the inkjet recording apparatus of FIG. 3.

Hereinbelow, an example of an inkjet recording apparatus having the inkjet recording head 2 is explained with reference to FIGS. 3 and 4. FIG. 3 is a schematic diagram illustrating an outline of an example of an inkjet recording apparatus having the inkjet recording head 2 of FIG. 1, and FIG. 4 is a top view of a portion of the inkjet recording apparatus of FIG. 3.

As schematically illustrated in FIG. 3, the inkjet recording apparatus 100 comprises a printing unit 102, an ink loading-and-holding unit 114, a sheet feeding unit 118, a decurling unit 120, a suction-type belt conveyer 122, a print detection unit 124, and a sheet output unit 126. The printing unit 102 comprises a plurality of inkjet recording heads 2K, 2C, 2M, and 2Y corresponding to inks of different colors (specifically, black (K), cyan (C), magenta (M), and yellow (Y)). Hereinafter, the inkjet recording heads may be referred to as heads. The ink loading-and-holding unit 114 holds the inks to be supplied to the heads 2K, 2C, 2M, and 2Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 2K, 2C, 2M, and 2Y constituting the printing unit 102 corresponds to the inkjet recording head 2 explained before.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

Power of a motor (not shown) is transmitted to at least one of the rollers 131 and 132 so that the endless belt 133 is driven clockwise in FIG. 3, and the recording sheet 116 held on the endless belt 133 is moved from left to right in FIG. 3.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 2K, 2C, 2M, and 2Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 4. Specifically, each of the heads 2K, 2C, 2M, and 2Y is a linear head in which a plurality of ink-discharge outlets (nozzles) are arrayed over a length exceeding the maximum length of a side of the largest recording sheet 116 on which the inkjet recording apparatus 100 can print an image. The heads 2K, 2C, 2M, and 2Y corresponding to the inks of the different colors are arrayed upstream in this order along the feeding direction as illustrated in FIG. 4. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 with a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes an output unit 126A for the prints for practical use and an output unit 126B for the test prints. Although not shown, the inkjet recording apparatus 100 further comprises a sorting unit which sorts the printed recording sheets 116 into the test prints and the prints for practical use, and sends the test prints to the output unit 126B, and the prints for practical use to the output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

CONCRETE EXAMPLES OF THE PRESENT INVENTION

The present inventor has produced concrete examples 1 to 3 of the piezoelectric device according to the present invention and a comparison example 1 of a conventional piezoelectric device as indicated below. The conditions under which the concrete examples 1 to 3 and the comparison example 1 are produced are summarized in Table 1.

Concrete Example 1

The concrete example 1 of the piezoelectric device according to the present invention is produced as follows.

First, an SOI substrate having a diameter of 6 inches (approximately 150 mm) is prepared. The SOI substrate is produced by forming an $SiO_2$ film having a thickness of approximately 300 nm and an active layer of silicon having a thickness of 15 micrometers in this order on a (100) silicon substrate.

Next, a seed layer of titanium having a thickness of 30 nm and a lower electrode of iridium having a thickness of 150 nm are formed in this order on an approximately entire upper surface of the above SOI substrate at the substrate temperature of 200° C. in an argon atmosphere with a vacuum degree of 0.5 Pa by using a sputtering system. After the formation of the lower electrode is completed, in order to thermally diffuse titanium from the seed layer, the SOI substrate on which the seed layer and the lower electrode are formed is left in the sputtering system, and the substrate temperature is raised to 525° C. and maintained for 2 hours.

Thereafter, a piezoelectric film of PZT having a thickness of 5 micrometers is formed on an approximately entire upper surface of the lower electrode by using a target of Pb1.3Zr0.52Ti0.4803 in the same sputtering system while maintaining the substrate temperature at 520° C. in an atmosphere of a mixture of Ar and 3.0 volume percent $O_2$ with a vacuum degree of 0.5 Pa.

Further, upper electrodes of platinum having a thickness of 100 nm are formed on the above piezoelectric film of PZT by using the same sputtering system. Finally, the bottom surface of the SOI substrate is etched by RIE (reactive ion etching) so that ink chambers having the dimensions of 500×500 micrometers with the ink outlets are formed, and the active layer of silicon is used as the aforementioned diaphragm. Thus, the diaphragm and the ink nozzles each having an ink chambers and an ink outlet are formed by processing the SOI substrate per se, and the production of the concrete example 1 of the piezoelectric device according to the present invention is completed.

Concrete Examples 2 and 3

The concrete examples 2 and 3 of the piezoelectric device according to the present invention are produced in similar manners to the concrete example 1 except that the substrate temperatures during the thermal diffusion and the formation of the piezoelectric film are different from the concrete example 1 as indicated in Table 1.

Comparison Example 1

The comparison example 1 of the piezoelectric device is produced as follows.

The piezoelectric film is formed immediately (specifically at most 5 minutes) after the formation of the lower electrode, i.e., the thermal diffusion of titanium is not performed. The other conditions are similar to the concrete example 1 as indicated in Table 1.

Evaluation 1

The concrete examples 1 to 3 of the piezoelectric device according to the present invention and the comparison example 1 are evaluated with respect to the following evaluation items (i) to (v).

(i) Surface Observation of the Lower Electrode by AFM

The upper surface of the lower electrode immediately before the formation of the piezoelectric film (after the thermal diffusion of titanium in the cases of the concrete examples 1 to 3, and immediately after the formation of the lower electrode in the cases of the comparison example 1) is observed by an AFM (atomic force microscope).

(ii) Surface Roughness of the Lower Electrode

The arithmetic average surface roughness Ra of the lower electrode immediately before the formation of the piezoelectric film is measured in accordance with JIS (Japanese Industrial Standard) B0601-1994.

(iii) Cross-Sectional Observation of Interface Between Lower Electrode and Piezoelectric Film The interface between the lower electrode and the piezoelectric film and the vicinity of the interface in a cross section perpendicular to the interface is observed by a TEM (transmission electron microscope) after the formation of the piezoelectric film.

(iv) XRD Measurement

Measurement by powder X-ray diffraction (XRD) is performed after the formation of the piezoelectric film.

(v) Piezoelectric Constant d31

The piezoelectric constant d31 of the piezoelectric device produced as each of the concrete examples 1 to 3 and the comparison example 1 is measured.

The measured values of the arithmetic average surface roughness Ra of the lower electrodes and the piezoelectric constant d31 of the concrete examples 1 to 3 and the comparison example 1 are also shown in Table 1. In addition, FIG. 5A shows an AFM photograph of the upper surface of the lower electrode in the comparison example 1, and FIG. 5B shows an AFM photograph of the upper surface of the lower electrode in the concrete example 2.

In the comparison example 1 (in which titanium is not thermally diffused although the titanium seed layer is formed), the upper surface of the lower electrode observed by AFM before the formation of the piezoelectric film (immediately after the formation of the lower electrode) is approximately flat as indicated in FIG. 5A, and the arithmetic average surface roughness Ra of the upper surface of the lower electrode is measured to be 0.3 nm. The condition of the upper surface of the lower electrode in the comparison example 1 before the formation of the piezoelectric film is similar to the conditions of the upper surfaces of the lower electrodes in the concrete examples 1 to 3 before the thermal diffusion of titanium.

In addition, no indication of titanium precipitate is observed in the cross section of the comparison example 1 which contains the interface between the lower electrode and the piezoelectric film and is observed by the TEM.

The XRD measurement of the piezoelectric film in the comparison example 1 indicates that the piezoelectric film does not exhibit the crystal orientation of the perovskite structure, and contains only the pyrochlore phase, i.e., the degree of crystal orientation of the piezoelectric film in the comparison example 1 is almost zero. Therefore, the piezoelectric film in the comparison example 1 does not exhibit piezoelectricity, and the piezoelectric constant d31 cannot be measured.

On the other hand, in each of the concrete examples 1 to 3 (in which titanium is thermally diffused from the titanium seed layer), the upper surface of the lower electrode after the thermal diffusion of titanium, observed by the AFM, indicates an irregularity like a number of ranging, gently-sloping mountains as indicated in FIG. 5B. The measured values of the arithmetic average surface roughness Ra of the upper surfaces of the lower electrodes in the concrete examples 1 to 3 are 0.5 to 8.0 nm, and greater than the measured value of the comparison example 1. In addition, the measurement results indicate a tendency that rise in the thermal diffusion temperature increases the arithmetic average surface roughness Ra.

Further, the cross sections of the concrete examples 1 to 3 each of which contains the interface between the lower electrode and the piezoelectric film and is observed by the TEM indicate that insular titanium precipitate is deposited at the positions corresponding to the valleys between the gently-sloping mountains on the upper surface of the lower electrode.

Furthermore, the XRD measurement of the piezoelectric film in each of the concrete examples 1 to 3 indicates that the piezoelectric film exhibits prominent crystal orientation along the (100) face, and the degree of crystal orientation is 99.0% or higher. In addition, the measured values of the piezoelectric constant d31 of the concrete examples 1 to 3 are 110 to 182 pm/V, i.e., indicate high piezoelectric performance. In particular, in the concrete examples 1 and 2, in which the film-formation temperatures for the piezoelectric film are in the range of 500 to 580° C., it is possible to obtain a piezoelectric device which has the piezoelectric constant d31 of 150 pm/V or greater, i.e., a piezoelectric device which exhibits higher piezoelectric performance than the piezoelectric element disclosed in JPP 2004-186646.

In addition to the concrete examples 1 to 3 and the comparison example 1, the present inventor has further produced a concrete example 4 of the piezoelectric device according to the present invention and a comparison example 2 of a conventional piezoelectric device as indicated below. The conditions under which the concrete example 4 and the comparison example 2 are produced are summarized in Table 2.

Concrete Example 4

The concrete example 4 of the piezoelectric device according to the present invention is produced in a similar manners to the concrete example 1 except that the substrate temperatures during the thermal diffusion and the formation of the piezoelectric film are different from the concrete example 1 as indicated in Table 2.

Comparison Example 2

The comparison example 2 of the piezoelectric device is produced as follows.

The piezoelectric film is formed immediately (specifically at most 5 minutes) after the formation of the lower electrode so that the thermal diffusion of titanium is not performed. The other conditions are similar to the concrete example 4 as indicated in Table 2.

Evaluation 2

The concrete example 4 of the piezoelectric device according to the present invention and the comparison example 2 are also evaluated with respect to the aforementioned evaluation items (i) to (v). The measured values of the arithmetic average surface roughness Ra of the lower electrodes and the piezoelectric constant d31 of the concrete example 4 and the comparison example 2 are also shown in Table 2. As explained in detail below, the concrete example 4 exhibits similar performance to the concrete examples 1 to 3, and the comparison example 2 exhibits similar performance to the comparison example 1.

In the comparison example 2 (in which titanium is not thermally diffused although the titanium seed layer is formed), the piezoelectric film does not have the perovskite structure, and has only the pyrochlore phase, which does not exhibit piezoelectricity. Therefore, the piezoelectric constant d31 cannot be measured.

On the other hand, in the concrete example 4 (in which titanium is thermally diffused from the titanium seed layer), the upper surface of the lower electrode after the thermal diffusion of titanium, observed by the AFM, indicates an irregularity like a number of ranging, gently-sloping mountains. In addition, the measured value of the arithmetic average surface roughness Ra of the upper surface of the lower electrode in the concrete example 4 is 0.5 nm, and greater than the measured value of the comparison example 2.

Further, the cross section of the concrete example 4 which contains the interface between the lower electrode and the piezoelectric film and is observed by the TEM indicates that insular titanium precipitate is deposited at the positions corresponding to the valleys between the gently-sloping mountains on the upper surface of the lower electrode.

Furthermore, the XRD measurement of the piezoelectric film in the concrete example 4 indicates that the piezoelectric film exhibits prominent crystal orientation along the (100) face, and the degree of crystal orientation is 99.0% or higher. In addition, the measured value of the piezoelectric constant d31 of the concrete example 4 is 170 pm/V, i.e., indicates high piezoelectric performance.

Although the thermal diffusion is performed for two hours in each of the concrete examples 1 to 4, the present inventor has confirmed that similar results are obtained even when the time for which the thermal diffusion is performed is varied within the range of 10 minutes to 2 hours. For example, similar results are obtained even in the case where the thermal diffusion is performed at 650° C. for 10 minutes, and the formation of the piezoelectric film is started after the temperature is dropped to 450 to 575° C.

In addition, the present inventor has confirmed that similar results are obtained even when a substrate of glass or stainless steel is used instead of the silicon substrate.

The present invention is not limited to the embodiment explained above. All suitable modifications and equivalents which will readily occur to those skilled in the art are regarded as falling within the scope of the invention.

TABLE 1

| | Substrate | Seed Layer (Thickness) | Lower Electrode (Thickness) | Thermal Diffusion Condition | Ra (nm) of Lower Electrode before Formation of Piezoelectric Film | Film-Formation Temperature (° C.) of Piezoelectric Film | Piezo-Electric Consist $d_{31}$ (pm/V) |
|---|---|---|---|---|---|---|---|
| Concrete Example 1 | Si | Ti (30 nm) | Ir (150 nm) | 525° C. 2 h | 1.0 | 525° C. | 182 |
| Concrete Example 2 | Si | Ti (30 nm) | Ir (150 nm) | 575° C. 2 h | 8.0 | 575° C. | 150 |
| Concrete Example 3 | Si | Ti (30 nm) | Ir (150 nm) | 450° C. 2 h | 0.5 | 450° C. | 110 |
| Comparison Example 1 | Si | Ti (30 nm) | Ir (150 nm) | No | 0.3 | 525° C. | Unmeasurable (Pyrochlore Phase) |

TABLE 2

| | Substrate | Seed Layer (Thickness) | Lower Electrode (Thickness) | Thermal Diffusion Condition | Ra (nm) of Lower Electrode before Formation of Piezoelectric Film | Film-Formation Temperature (° C.) of Piezoelectric Film | Piezo-Electric Consist $d_{31}$ (pm/V) |
|---|---|---|---|---|---|---|---|
| Concrete Example 4 | Si | Ti (30 nm) | Pt (150 nm) | 525° C. 2 h | 0.5 | 525° C. | 170 |
| Comparison Example 2 | Si | Ti (30 nm) | Pt (150 nm) | No | 0.4 | 525° C. | Unmeasurable |

What is claimed is:

1. A process for producing a piezoelectric device constituted by a first electrode, at least one second electrode, and a piezoelectric film sandwiched between the first electrode and the at least one second electrode so that an electric field can be applied to the piezoelectric film, comprising the steps of:
    (a) forming on a substrate a seed layer of a material containing at least one element;
    (b) forming said first electrode on said seed layer;
    (c) diffusing said at least one element through said first electrode so that the at least one element precipitates on a surface of the first electrode on a side opposite to the said seed layer; and
    (d) forming said piezoelectric film on said first electrode.

2. A process according to claim 1, wherein said at least one element includes at least one element constituting said piezoelectric film.

3. A process according to claim 1, wherein said piezoelectric film is formed in the step (c) at a temperature equal to or higher than 400° C. and lower than 600° C.

4. A process according to claim 1, wherein said seed layer has a thickness of 5 to 50 nm, and said first electrode has a thickness of 50 to 500 nm.

5. A process according to claim 1, wherein said at least one element is diffused so that said surface has an arithmetic average surface roughness (Ra) of 0.5 to 30.0 nm after the step (c) is completed.

6. A process according to claim 1, wherein said at least one element includes titanium.

7. A process according to claim 6, wherein said titanium is thermally diffused by heat treatment performed at a temperature in the range of 400° C. to 700° C.

8. A process according to claim 7, wherein thermal diffusion of said titanium is performed for 10 minutes to 2 hours.

9. A process according to claim 1, wherein said piezoelectric film has a tetragonal or rhombohedral crystal structure and crystal orientation along a (100) or (001) face.

10. A process according to claim 1, wherein said piezoelectric film is formed of at least one perovskite oxide or at least one mixed crystal of perovskite oxides, and said at least one perovskite oxide and said perovskite oxides are one or more of lead titanate, lead titanate zirconate, barium titanate, bismuth sodium titanate, bismuth potassium titanate, sodium niobate, potassium niobate, and lithium niobate.

11. A process according to claim 1, wherein one or more main components of said first electrode are one or more of Pt, Ir, $IrO_2$, $RuO_2$, $LaNiO_3$, or $SrRuO_3$.

12. A process according to claim 1, wherein said substrate is made of one of silicon, stainless steel, and glass.

13. A piezoelectric device produced by said process according to claim 1.

14. A piezoelectric device according to claim 13, wherein said piezoelectric film has a piezoelectric constant $d_{31}$ of 150 pm/V or greater.

* * * * *